(12) United States Patent
Lo

(10) Patent No.: US 6,295,203 B1
(45) Date of Patent: Sep. 25, 2001

(54) HEAT SINK CLIP ASSEMBLY

(75) Inventor: Wei-Ta Lo, Miou-Li (TW)

(73) Assignee: Foxconn Precision Components Co., Ltd., Taipei Hsien (TW)

( * ) Notice: Subject to any disclaimer, the term of this patent is extended or adjusted under 35 U.S.C. 154(b) by 0 days.

(21) Appl. No.: 09/611,875

(22) Filed: Jul. 7, 2000

(30) Foreign Application Priority Data

Apr. 5, 2000 (TW) ................................. 089205396

(51) Int. Cl.⁷ ...................................................... H05K 7/20
(52) U.S. Cl. ........................... 361/704; 24/457; 248/510; 257/719; 439/485
(58) Field of Search ..................... 24/457, 625; 267/150, 267/158, 160; 248/316.7, 505, 510; 165/80.3, 185; 174/16.3; 439/485, 487; 257/706, 707, 718, 719, 726, 727, 722; 361/703, 704, 710, 722, 717–719

(56) References Cited

U.S. PATENT DOCUMENTS

| | | | |
|---|---|---|---|
| 4,679,118 | * | 7/1987 | Johnson et al. ....................... 361/718 |
| 5,170,325 | * | 12/1992 | Bentz et al. ........................... 361/707 |
| 5,208,731 | * | 5/1993 | Blomquist ............................. 361/704 |
| 5,386,338 | * | 1/1995 | Jordan et al. ......................... 361/704 |
| 5,594,624 | * | 1/1997 | Clemens et al. ..................... 361/704 |
| 6,130,821 | * | 10/2000 | Gerber .................................. 361/704 |
| 6,181,559 | * | 1/2001 | Seo . | |

* cited by examiner

Primary Examiner—Gerald P Tolin
(74) Attorney, Agent, or Firm—Wei Te Chung

(57) ABSTRACT

A clip assembly (40) for mounting a heat sink (30) to an electronic device (20) retained on a socket connector (10) includes a clip (50) and a fastener (60). The clip has an elongate spring portion (52) engaging a surface of the heat sink and two legs (54) extending from the spring portion for engaging with catches (12) of the socket connector, thereby securing the heat sink to the electronic device. The fastener includes a pair of latches (62) and a resilient connecting section (66) connected between the latches. Each latch has a protrusion (64) extending from a distal end thereof, each protrusion extending towards the opposite protrusion. The heat sink forms a plurality of fins (34) defining a slot (36) therebetween for receiving the clip and the fastener. The latches are configured to engage with grooves (38) defined in fins on opposite sides of the slot of the heat sink, thereby securely attaching the clip to the heat sink and effectively eliminating relative movement between the clip and the heat sink.

6 Claims, 4 Drawing Sheets

HEAT SINK CLIP ASSEMBLY

BACKGROUND

1. Field of Invention

The present invention relates to a clip assembly for securing a heat sink to an electronic device, and particularly to a clip assembly having a fastener for eliminating relative movement of the clip and the heat sink.

2. Description of Related Art

An electronic device, such as a central processing unit (CPU), operates at a high speed for processing signals and data. A great amount of heat is generated due to the high speed operation. A heat sink is often used to remove heat from the CPU for keeping the CPU at an acceptable working temperature. A clip is required to secure the physical contact between the heat sink and the CPU.

A conventional clip 3, as shown in FIG. 3 of the attached drawings, comprises a spring central portion engaging a surface of the heat sink and two legs extending therefrom for engaging with a CPU socket connector, thereby securing the heat sink to the CPU mounted on the socket connector. The clip 3 suffers a disadvantage of being readily detached from the heat sink 5 by accidental force disengaging the clip 3 from the socket connector.

With the trend toward miniaturization in the computer industry, a flip-chip package is broadly used in CPU modules. Referring to FIG. 4, a flip chip is usually formed on a substrate. The conventional clip 3 attaches the heat sink 5 to the flip chip 7. However, the heat sink 5 is readily rotated about a die edge of the flip chip 7. Thus the heat sink 5 cannot be in full contact with the flip chip 7, which diminishes the removing heat efficiency of the heat sink 5.

It is thus desired to provide a heat sink clip which overcomes the above problems encountered in the prior art.

SUMMARY OF THE INVENTION

Accordingly, an object of the present invention is to provide a clip assembly comprising a fastener for securely attaching the heat sink to an electronic device.

To achieve the above-mentioned object, a clip assembly in accordance with the present invention comprises a clip securely attaching a heat sink to an electronic device and a fastener abutting against the clip for preventing the clip from moving relative to the heat sink. The clip has a spring portion engaging a surface of the heat sink and two legs extending from the spring portion for engaging with catches formed on a socket connector on which the electronic device is retained. The fastener comprises a pair of latches and a resilient connecting section connected between the latches. Each latch has a protrusion extending from a distal end thereof, each protrusion extending toward the opposite protrusion for engaging with a groove defined in the heat sink for securing the clip to the heat sink.

Other objects, advantages and novel features of the present invention will be drawn from the following detailed embodiment of the present invention with attached drawings, in which:

DESCRIPTION OF THE PREFERRED EMBODIMENT

Figure 1:
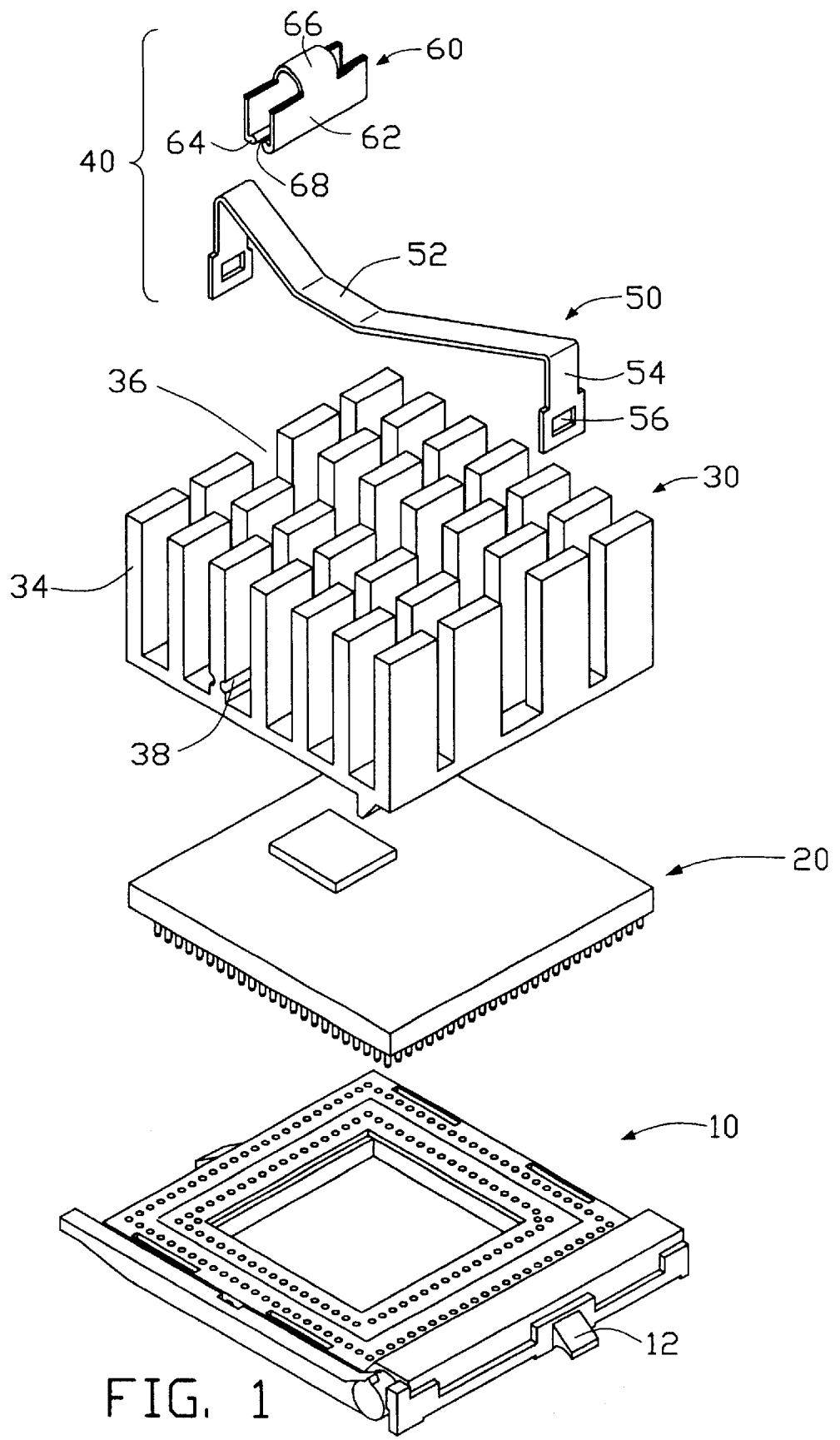
FIG. 1 is an exploded view of a clip assembly constructed in accordance with the present invention together with a heat sink, integrated circuit module, and socket connector.
Figure 2:
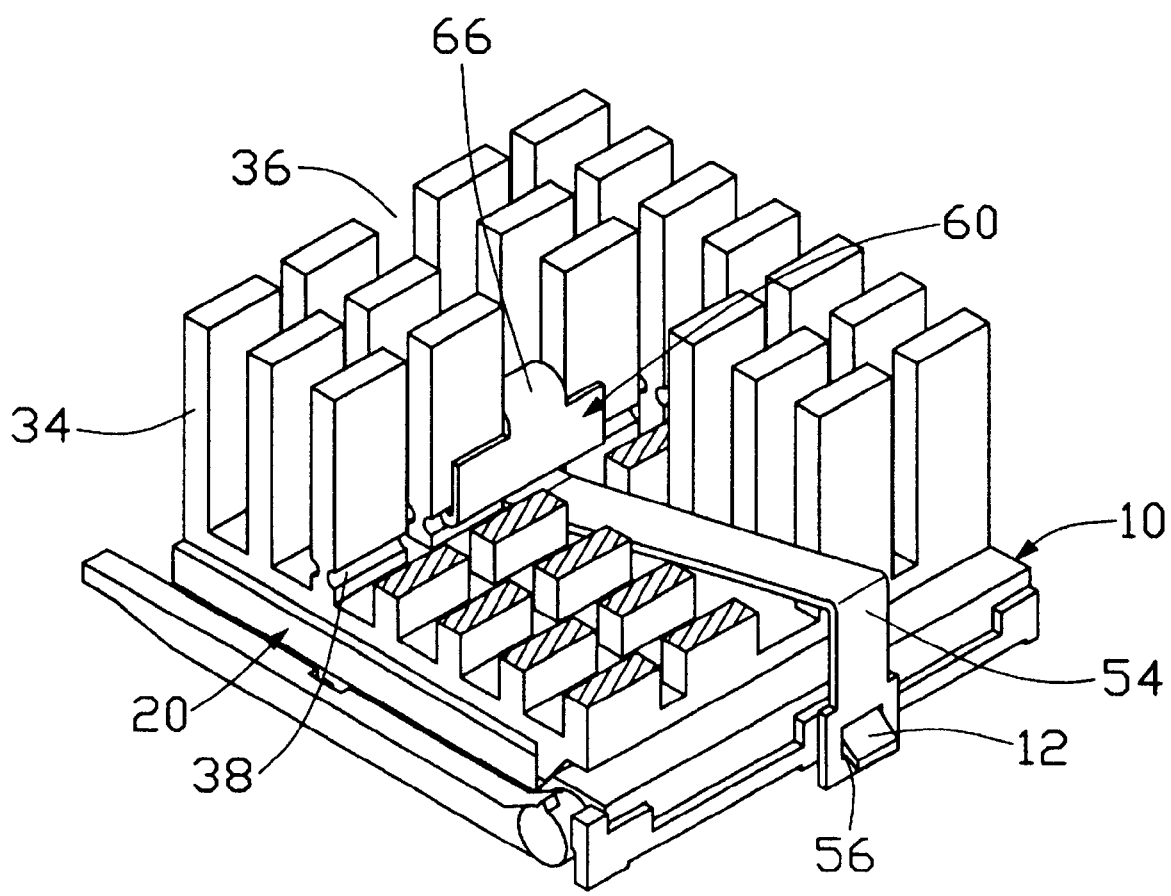
FIG. 2 is an assembled view of FIG. 1 with a portion of the heat sink being cut away.
Figure 3:
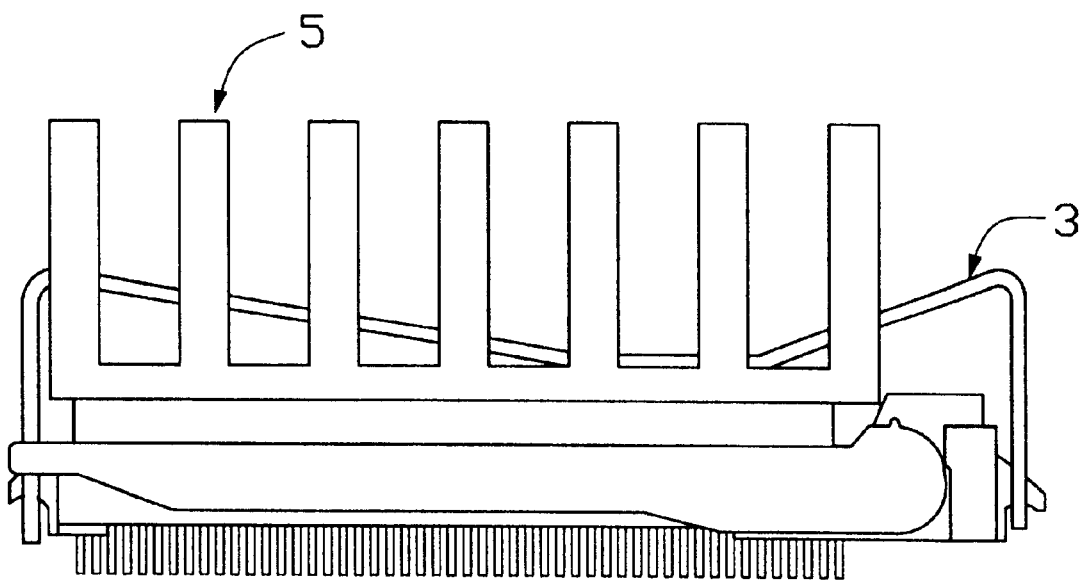
FIG. 3 is a side view of a conventional clip assembly mounted to an IC package and connector.
Figure 4:
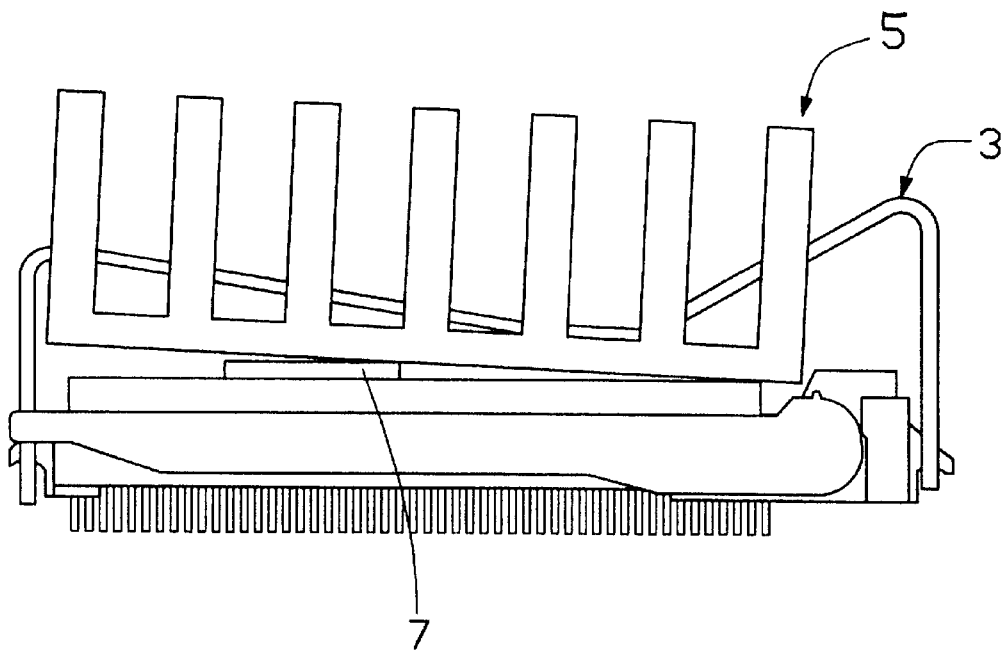
FIG. 4 is similar to FIG. 3 but showing a heat sink attached to another type of CPU.

Referring to the attached drawings, FIGS. 1 and 2 show a clip assembly 40 constructed in accordance with the present invention for mounting a heat sink 30 to an integrated circuit module 20, such as a central processing unit (CPU) retained on a socket connector 10. The clip assembly 40 comprises a clip 50 and a fastener 60.

The clip 50 may be constructed from a metallic material to provide an adequate spring force to press the heat sink 30 to the CPU 20 for forming a firm physical contact therebetween. The clip 50 comprises an elongate spring portion 52 received in and extending across a slot 36 formed between fins 34 of the heat sink 30. The spring portion 52 comprises a central portion 55 positioned on and engaging with a surface of the heat sink 30, and two inclined spring arms (not labeled) extending from opposite ends of the central portion with a gap between each spring arm and the surface of the heat sink 30 for providing resiliency. Two legs 54 extend downward from the spring arms of the spring portion 52, each defining an aperture 56 for engaging with a catch 12 formed on the socket connector 10 for securing the heat sink 30 to the CPU module 20 and the socket connector 10.

The fastener 60, which may be constructed from a metallic material, comprises a pair of parallel and spaced latches 62 and a resilient connecting section 66 connected between the latches 62. Each latch 62 has a protrusion 64 extending from a distal end thereof, each protrusion 64 extending toward the opposite protrusion 64 with a gap 68 therebetween. The connecting portion 66 has a width snugly received in the slot 36 of the heat sink 30, while the latches 62 have a width greater than that of the connecting portion 66 whereby the latches 62 engage with the fins 34 on opposite sides of the slot 36. Grooves 38 are defined in the fins 34 on opposite sides of the slot 36 for engagingly receiving the protrusions 64 of the fastener 60 thereby fixing the fastener 60 to the heat sink 30 which in turn secures the clip 50 in position.

In assembly, the clip 50 is positioned in the slot 36 of the heat sink 30 and the spring arms are flexed so that the apertures 56 engage with the catches 12 of the socket connector 10 thereby pressing the heat sink 30 to stably and physically contact the CPU 20 mounted on the socket 10. The fastener 60 is deposited into the slot 36 above the clip 50. The latches 62 are elastically deformed to allow the fins 34 to extend through the gap 68 and the fastener 60 is pressed downward until the protrusions 64 engage the grooves 38 of the fins 34. Thus the fastener 60 is securely fixed to the heat sink 30. The latches 62 of the fastener 60 are configured to contact the clip 50 whereby the clip 50 is securely attached to the heat sink 30 and relative movement therebetween is effectively eliminated.

While an exemplary embodiment has been described and shown in the accompanying drawings, it is to be understood that such an embodiment is merely illustrative of and not to be limited to the specific constructions and arrangements shown and described, since various other modifications may occur to those ordinarily skilled in the art.

What is claimed is:

1. A clip assembly adapted to secure a heat sink to an electronic device comprising:

a clip having a spring portion engaging the heat sink and a pair of legs extending from the spring portion for engaging with catches of a connector on which the electronic device is mounted thereby securing the heat sink to the electronic device; and a fastener having opposite protrusions securely engaging with grooves defined in opposite sides of a fin of the heat sink and pressing the spring portion of the clip for securing the clip and limiting movement of the clip relative to the heat sink.

2. The clip assembly recited in claim 1, wherein said fastener comprises a pair of vertical and parallel latches and a resilient connecting section connected between the latches.

3. The clip assembly recited in claim 2, wherein said each latch forms one of the protrusions at a distal end thereof, said protrusions extending toward each other and engaging with the grooves of the fin of the heat sink and pressing the clip thereby securing the clip to the heat sink.

4. A heat sink assembly comprising:

a heat sink comprising a plurality of upwardly extending fins and a transverse slot therein, the fins adjacent to the slot defining grooves positioned on a lower portion of both sides of each fin;

a clip fastened to a socket and including a central portion received within the transverse slot and abutting against a top surface of the heat sink; and a fastener comprising a fastening portion engaging with the grooves on both sides of the same fin of the heat sink and abutting against a top of the central portion of the clip for securing the clip to the heat sink and preventing the clip from moving relative to the heat sink.

5. The heat sink assembly recited in the claim 4, wherein said fastener comprises a pair of parallel latches each forming a protrusion extending toward each other and engaging with the grooves defined in the fins.

6. The heat sink assembly recited in the claim 4, wherein the pair of latches are space from each other and a resilient connecting section connected between the pair of latches.

* * * * *